(12) United States Patent
Hirschmann

(10) Patent No.: US 6,507,203 B1
(45) Date of Patent: Jan. 14, 2003

(54) TEST HEAD ASSEMBLY

(75) Inventor: Peter Hirschmann, Herrenberg (DE)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/451,896

(22) Filed: Dec. 1, 1999

(30) Foreign Application Priority Data

Mar. 19, 1999 (EP) .......................................... 99105625

(51) Int. Cl.[7] .............................................. G01R 31/02
(52) U.S. Cl. ..................... 324/754; 324/158.1; 324/761; 324/72.5
(58) Field of Search .............................. 324/158.1, 754, 324/761, 765, 755, 757, 758, 760; 414/768, 222, 416; 209/573, 571

(56) References Cited

U.S. PATENT DOCUMENTS

| | | | |
|---|---|---|---|
| 4,087,747 A | * | 5/1978 | Deegen et al. .............. 324/72.5 |
| 4,145,620 A | * | 3/1979 | Dice ............................ 324/73 |
| 4,746,861 A | * | 5/1988 | Nesbitt ...................... 324/158.1 |
| 5,012,187 A | * | 4/1991 | Littlebury ................. 324/158.1 |
| 5,463,325 A | * | 10/1995 | Fujii ........................... 324/761 |
| 5,489,852 A | | 2/1996 | Gomez |
| 5,745,346 A | | 4/1998 | Ogawa et al. |
| 5,828,223 A | | 10/1998 | Rabkin et al. |
| 5,949,242 A | * | 9/1999 | Wood et al. ................ 324/760 |
| 6,208,157 B1 | * | 3/2001 | Akram et al. ............... 324/755 |

FOREIGN PATENT DOCUMENTS

| | | | |
|---|---|---|---|
| EP | 0818684 A2 | 1/1998 | |
| JP | 4-216642 | * 4/1992 | .............. 324/158.1 |
| WO | WO92/04989 | 4/1992 | |

OTHER PUBLICATIONS

European Search Report, EP 99 10 5625, Aug. 20, 1999.

* cited by examiner

*Primary Examiner*—Michael Sherry
*Assistant Examiner*—Jimmy Nguyen

(57) ABSTRACT

Disclosed is a test head assembly for a test system, comprising a test head having a plurality of test head contact areas for providing electronic signals to one or more devices under test (DUT) and/or for receiving electronic signals therefrom. The test head assembly further comprises fastening means for fastening one or more individual, physically separated DUT boards to the test head, each DUT board being provided for holding one or more of the DUTs and adapting electrical contacts thereof to at least one of the plurality of test head contact areas. In order to provide a flexible and modular test head arrangement allowing an easy exchange of different DUT boards with different seizes, the arrangement of the fastening means and the plurality of test head contact areas is commensurable, so that one or more DUT boards with same and/or different lateral dimensions are attachable to the test head.

17 Claims, 7 Drawing Sheets

TEST HEAD ASSEMBLY

FIELD OF THE INVENTION

The present invention relates to test head assembly for a test system.

BACKGROUND OF THE INVENTION

Electronic devices, such as integrated circuits (ICs), are normally tested after production and before use. As an example of a test system generally applied for testing purposes, automatic test equipment (ATE) is designed to conduct analysis of functional or static parameters to evaluate the degree of performance degradation and may be designed to perform fault isolation of unit malfunctions. The decision making, control, or evaluative functions are normally conducted with minimum reliance on human intervention.

FIG. 1A illustrates, in a generalized cross sectional view, a typical test system as known in the art, such as the Hewlett-Packard HP 83000 or HP 95000 series. For testing a device under test (DUT) 20, the test system 10 comprises a tester 30 and a test head assembly 35. The test head assembly 35 represents the mechanical and electrical interface between the DUT 20 and the tester 30. The tester 30 generally comprises test electronic for generating test signals and evaluating signals received from the DUT 20.

The test head assembly 35 comprises a test head 40 and at least one DUT board 60. The DUT 20 might be fixed directly or via a socket 50 to the DUT board 60, which, again, is normally mechanically fixed to the test head 40 by means of a fixture 70.

The DUT board 60 represents the mechanical and electrical interface between the DUT 20 and the test head 40. The DUT board 60 is also employed to adapt electrical contacts from the DUT 20 to electrical contacts at the test head 40. In particular with respect to miniaturized ICs, the necessity of such an adaptation of the miniaturized contacts of the DUT 20 to larger contacts of the test head assembly 35 becomes readily apparent.

The fixture 70 is employed for mechanically holding and fixing the DUT 20 via the DUT board 60 to the test head 40 and to allow exchanging the DUT board 60.

FIG. 1B illustrates, in an explosive side view, a typical principle for fixing the DUT board 60 to the test head 40, as employed e.g. in the Hewlett-Packard. HP 83000 or HP 95000 series. The DUT board 60 can be mechanically affixed to the test head 40 by means of a plurality of screws 80, whereby a stiffener-90, as part of the fixture, can be arranged therebetween. When the DUT board 60 is mechanically affixed to the test head 40, one or more contact areas 95A, 95B and 95C of the test head 40 electrically couple to contact areas 100A, 100B and 100C of the DUT board 60.

The contact areas 95A, 95B and 95C comprise a plurality of pins (not shown in detail), such as spring loaded pins, which will be forced/pushed against respective contact pads 110 (shown in FIGS. 2) of the.contact areas 100A, 100B and 100C of the DUT board 60 for providing a good electrical contact. Since the DUT boards 60 are generally formed of flexible plastic material, the stiffener 90 is employed for avoiding bending of the DUT board 60 under the influence of the contact pressure.

While the DUT board 60 in FIG. 1B is affixed to the test head 40 by means of mechanical connecting means such as the screws 80, FIG. 1C illustrates another principle wherein the DUT board 60 is affixed to the test head 40 by means of negative pressure means as employed e.g. in the Teradyne Integra series J750. The top part of FIG. 1C shows a cross sectional view, while the lower part depicts a worm eye's view from the direction of arrows A. Vacuum slots 120 in the test head 40 are arranged close to the contact areas 100A and 100B for-removing air. Rubber seal lips 130A and 130B are provided for establishing a negative pressure between the DUT board 60 and the test head 40, thus attaching the DUT board 60.

It is to be understood that, in general, for each different DUT 20 a specific and thus different DUT board 60 has to be provided for adapting the specific layout of contacts of the respective DUT 20 to the contact areas 95 provided from the test head 40. Employing exchangeable DUT boards 60 renders the test system 10 capable for testing a plurality of different DUTs 20. It is clear that different test algorithms may have to be provided by the tester 30 for any different DUT 20.

FIGS. 2A to 2D show examples of DUT boards 60 as known in the art. The one or more DUTs 20 are generally located in the center of the respective DUT board 60. It is clear that number of DUTs 20 on one respective DUT board 60 is limited by the sizes and/or pin counts (i.e. the number of pins or other individual electrical contacts) of the respective DUTs 20, the pin count (channels) of the test head 40, and the available area in the center of the DUT board 60. Each DUT board 60 comprises one or more contact areas 100 comprising a plurality of individual contact pads 110 electrically coupled to the (one or more) DUT 20, preferably via strip conductors of the DUT board 60.

When the DUT board(s) 60 is/are fastened to the test head 40, individual contact areas 95 of the test head 40 couple to the respective contact areas 100 for providing an electrical contact between the test head 40 and the DUT(s) 20. Spring-loaded cable assemblies designed in accordance with the respective contact areas 100 couple thereto for establishing the electrical contact, between the respective DUT boards 60 and thee test head 40.

Changing between different DUTs 20, however, generally requires a change in the hardware, of the test head assembly 35 adapted to the specific arrangement of DUTs 20 and their respective contact areas 100. In most cases, however, only the respective DUT boards 60 have to be exchanged. FIGS. 2A and 2B illustrate center arrangements of the DUT board 60. The DUT board 60 in FIG. 2A comprises four contact areas 100A, 100B, 100C and 100D substantially arranged around the DUT 20. An example of an embodiments according to FIG. 2A can be found e.g. in the Hewlett-Packard HP 83000 Series. In FIG. 2B, only one contact area 100 is provided which substantially encircles the DUT 20. An embodiment according to FIG. 2B can be found e.g. in the Teradyne J971 or Schlumberger S9000 series. The center arrangements of FIGS. 2A and 2B are mainly used for optimizing timing delay requirements in that the contact area 100 is designed in a way that the individual contacts thereof are located as close as possible to the corresponding contacts of the DUT 20.

FIG. 2C shows a device-specific arrangement for a plurality of individual (i.e. physically separated) DUT boards 60. Each DUT 20 is located in the center of a respective DUT board 60, whereby only one DUT 20 is applied on each DUT board 60. The contact area 100 of each DUT board 60 is device-specific and may substantially correspond to the centered arrangement according to FIG. 2A, An example of an embodiment according to FIG. 2C can be found in the Hewlett-Packard HP 95000 Series. The device-specific arrangement according to FIG. 2C in particular fits the requirements of short timedelay and multi-site testing.

FIG. 2D shows a DUT board 60 designed for the specific requirements of the negative pressure attachment systems as depicted in FIG. 1C. One or more DUTs 20 are arranged in a row between parallel contact areas 100.

It has to be understood and it is expressly noted that the different attaching systems as depicted in FIGS. 1C and 1D require entirely different solutions for the design of the, DUT board 60. Whereas the mechanical connecting system according to FIG. 1B allows to arrange a plurality of individual DUT boards 60 as shown in FIG. 2C, the negative pressure attachment system of FIG. 1C requires that all DUTs 20 have to be located on one single. DUT board 60 since the negative pressure applied through the vacuum slots 120 requires an uninterrupted space between the contact areas 95 and 100. A separation into individual DUT boards 60 would require a modification of the negative pressure applying means arranged in the test head 40. Such modifications at the test head 40, however, are normally very expensive and would require a detailed knowledge of the spatial dimensions of the specific arrangement of individual DUT boards 60.

Each of the designs of the DUT boards 60 in the FIGS. 2A–2D requires a specific design of parts corresponding to the DUT boards 60 of either or both the fixture 70 and the test head 40. This limits the exchangeability of different DUT boards 60 or requires costly modifications of corresponding parts at the test head site.

SUMMARY OF THE INVENTION

It is an object of the present invention to provide a more flexible test head arrangement allowing an easy exchange of different DUT boards.

According to the invention, a test head assembly for a test system comprises a test head having a plurality of test head contact areas, each with one or more individual contacts, for providing electronic signals to one or more devices under test—DUT—and/or for receiving electronic signals therefrom. The test head assembly further comprises fastening means for fastening one or more individual, physically separated DUT boards to the test head, each DUT board being provided for holding one or more of the DUTs and adapting electrical contacts thereof to at least one of the plurality of test head contact areas.

In order to provide a flexible and modular test head arrangement allowing an easy exchange of different DUT boards with different seizes, the arrangement of the fastening means and the plurality of test head contact areas is commensurable, so that one or more DUT boards with same and/or different lateral dimensions are attachable to the test head.

In a first preferred embodiment, the arrangement of the fastening means and the plurality of test head contact areas is commensurable in (only) one dimension (e.g. in the direction of the breadth of the DUT boards), so that one or more DUT boards with same and/or different seizes in that dimension can be attached to the test head preferably in a longitudinal row. Accordingly, the arrangement can provide and support more than one longitudinal rows, preferably arranged as substantially parallel rows, so that in each row one or more DUT boards with same and/or different seizes (e.g. breadths) in that dimension can be attached.

In the first embodiment the fastening means and the plurality of test head contact areas are preferably arranged in one or more longitudinal rows. Preferably, each DUT board comprises at least one DUT contact area having one or more individual contacts electrically coupled to the one or more DUTs of that respective DUT board. Each DUT contact area can be electrically coupled to at least one of the plurality of test head contact areas for providing an electrical contact between the respective DUT board and the test head, and each DUT contact, area is arranged substantially parallel to the one or more longitudinal rows.

In a second preferred embodiment, the arrangement of the fastening means and the plurality of test head contact areas is commensurable in two dimensions (e.g. in the direction of the breadth and the length of the DUT boards), so that one or more DUTT boards with same and/or different seizes in one or both of that two dimensions can be attached to the test head.

In the second preferred embodiment the fastening means and the plurality of test head contact areas are preferably arranged in accordance with the first embodiment. The second preferred embodiment, however, further comprises adapting means for adapting the test head contact areas to be coupled to a respective DUT board to the lateral dimensions of each DUT board. Preferably, the adapting means allow/s to either withdraw one or more test head contact areas from contacting the respective DUT board, or to couple only one or more test head contact areas to the respective DUT board.

The second preferred embodiment preferably provides a certain redundancy of fastening means and test head contact areas, so that a great variety of DUT boards with different lateral dimensions can be coupled to the test head.

It is clear that the respective DUT boards according to the invention have to be adapted to the test head assembly to be coupled to, so that the respective DUT contact areas are adapted to match with corresponding ones of the plurality of test head contact areas. This can be preferably accomplished by arranging the DUT contact areas in a predefined way, e.g. only in one or more parallel rows with defined distances between those rows, whereby the arrangement of the DUT contact areas substantially corresponds with the arrangement of the plurality of test head contact areas, e.g. with defined distances substantially match with defined distances between one or more parallel rows of the plurality of test head contact areas whereby the distances between the rows of the DUT contact areas and the test head contact areas substantially match.

BRIEF DESCRIPTION OF THE DRAWINGS

Other objects and many of the attendant advantages of the present invention will be readily appreciated and become better understood by reference to the following detailed description when considering in connection with the accompanied drawings. Features that are or can be built up substantially equally or similarly are referred to with the same reference sign.

DETAILED DESCRIPTION OF THE INVENTION

Figure 3A:
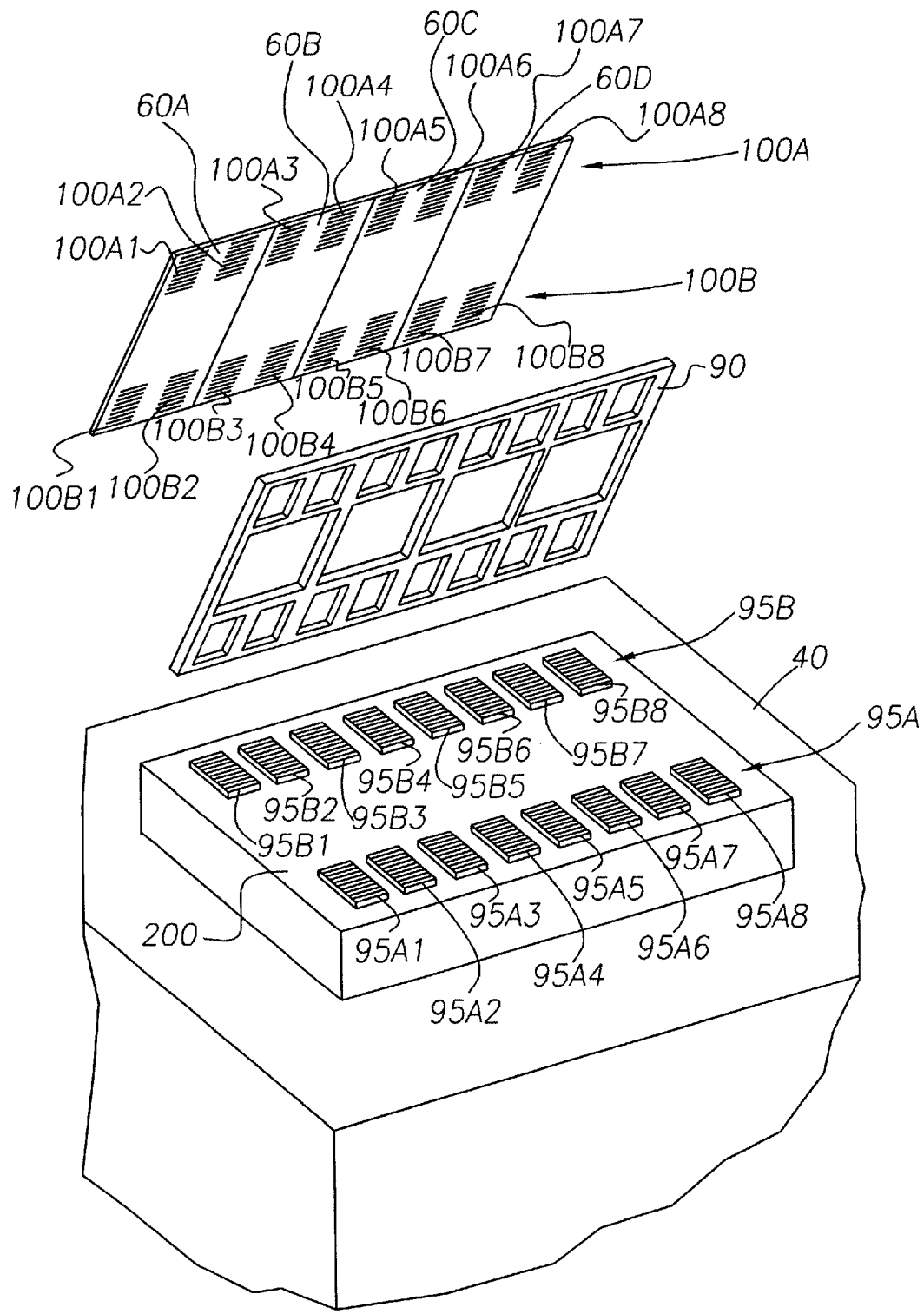
FIGS. 3A to 3C show embodiments of test head assemblies according to the invention.

FIG. 3A shows, in a three dimensional explosion view, an embodiment according to the invention of a test head assembly 35 and four DUT boards 60A, 60B, 60C and 60D, each carrying one or more DUTs 20. The DUTs 20 are not shown in FIG. 3A since the DUT boards 60A–60D are depicted in a worm's eye view, i.e. from the side to be attached towards the test head 40. The DUT boards 60i (with i=A . . . D) are mountable onto the stiffener 90 (also shown in FIG. 3A from the side to be attached to the test head 40). The stiffener 90, again, can be mounted onto the test head 40 via the fixture 70.

It is to be understood that the stiffener is only required for applications in which the DUT boards 60i might be bent or otherwise deformed under the influence of the contact pressure applied for providing a good electrical contact between the contact area 95a of the test head 40 and the contact areas 100 of the DUT board 60. In case that the DUT boards 60i are sufficiently stiff and/or the applied contact pressure is low enough, the DUT board 60i can be directly mounted onto the test head 40, preferably by means of screws or the like.

Figure 1A:
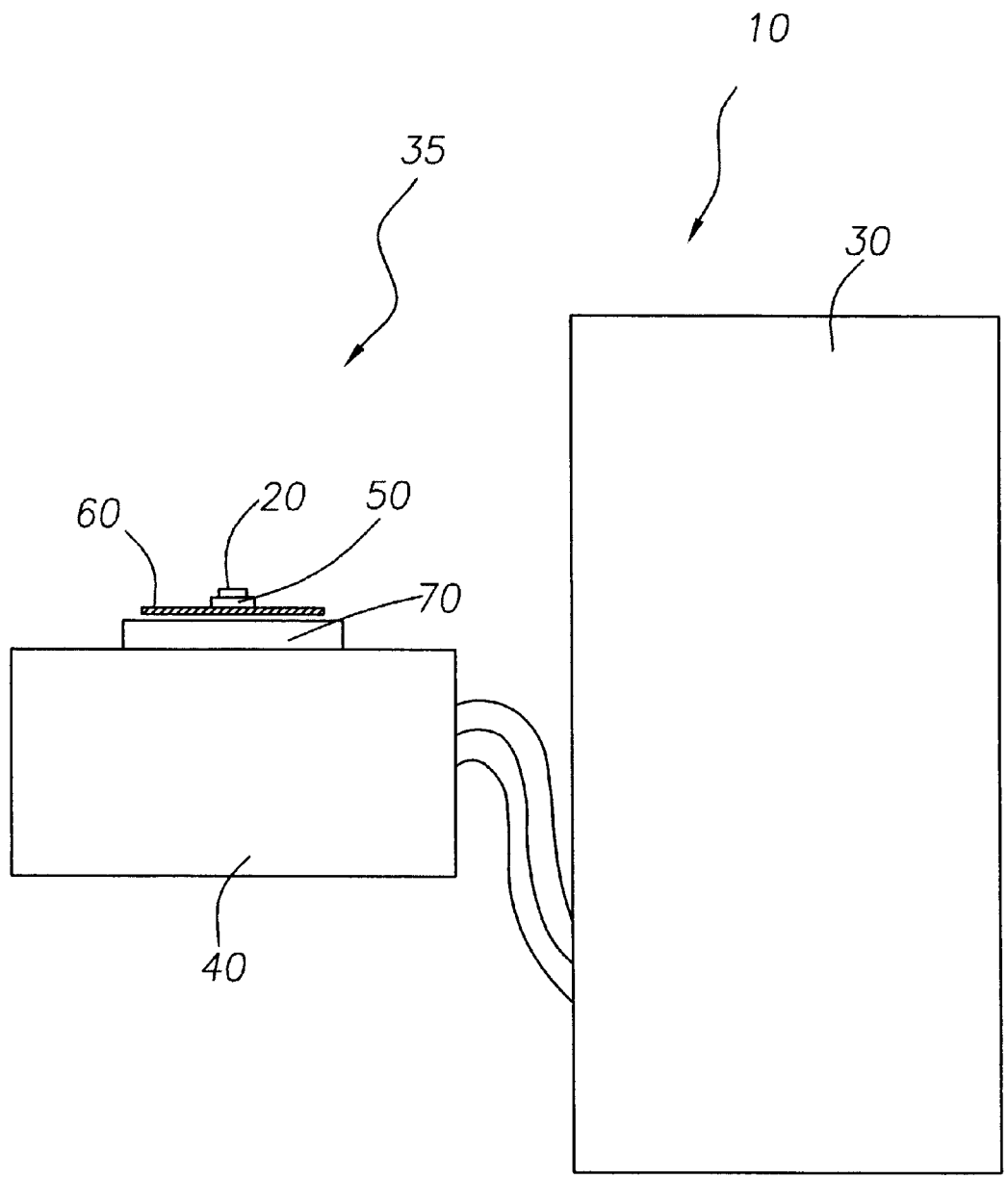
FIGS. 1A to 1C illustrate a typical test system as known in the art.
Figure 1B:
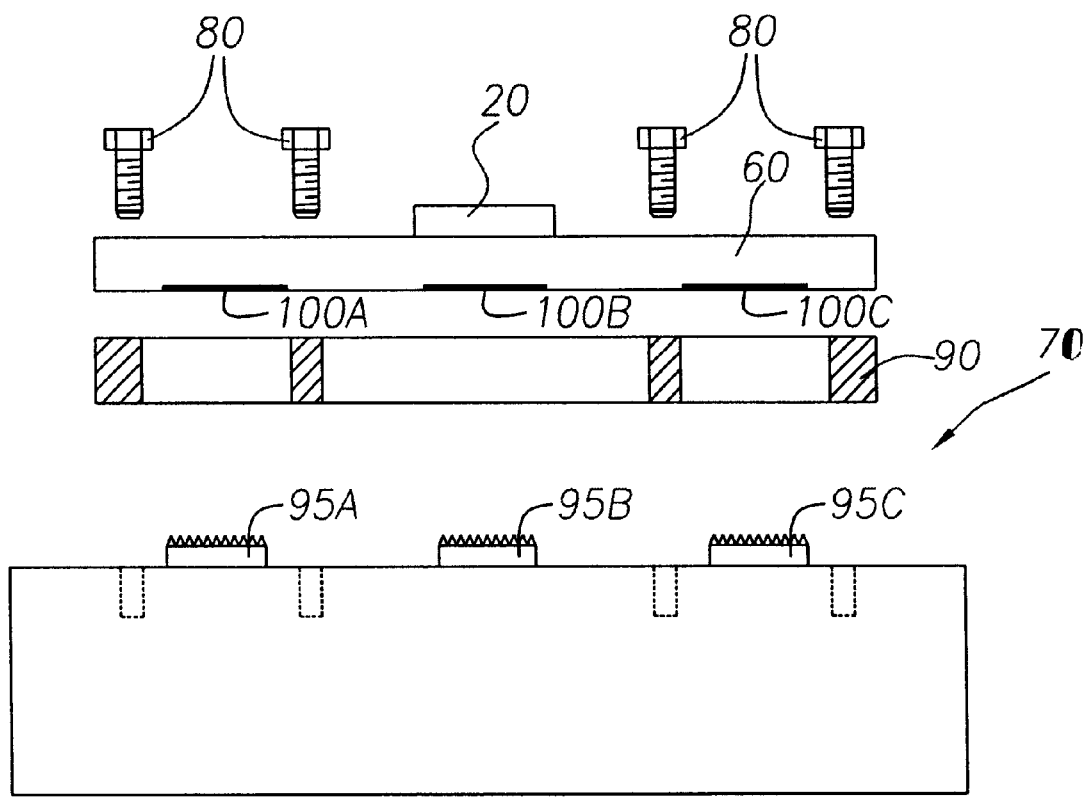
Figure 1C:
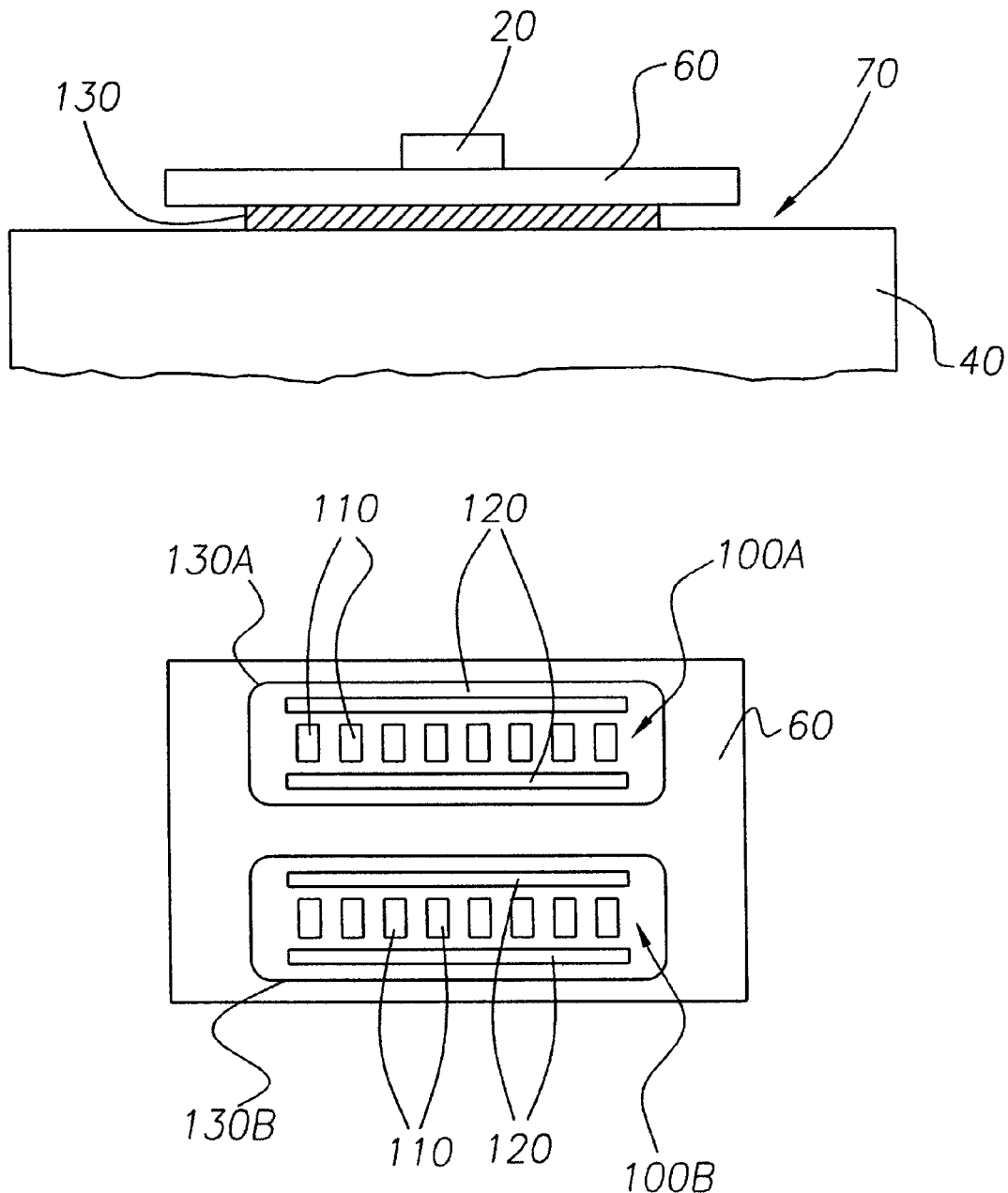

For mounting the DUT board 60i onto the test head 40, either directly or via the stiffener 90, respective mechanical connecting means, such as screws or the like, can be applied. However, any other means for mounting the DUT board 60i onto the test head 40 are applicable for the purposes of the invention, as long as those mounting means allow individually attaching and detaching each individual DUT board 60i to and from the test head 40. In case that negative pressure means are applied, it has to be made sure that each DUT board 60i can be individually attached by means of the negative pressure means. That means that, in contrast to the example shown in FIG. IC, the vacuum slots 120 have to be provided individually for each DUT board 60i and cannot cover more than one DUT board 60i. In other words, the embodiment of the DUT board. 60 shown in FIG. 1C could also serve the purpose of the invention. For testing more than one DUT boards 60, however, a plurality of DUT boards 60i according to FIG. 1C have to be aligned in a longitudinal row as shown e.g. for FIG. 3A. The provision of individual negative pressure means for each individual DUT board 601, on the other hand, might render the whole test head assembly 35 too expensive, so that mechanical connecting means are used preferably.

For allowing an easy exchange of DUT boards 60i with different breadth (in the direction of arrow A), the respective contact areas 100Aj (with j=1 . . . 8) are aligned in a longitudinal row 100A. Accordingly, the contact areas 100Bj are aligned in a longitudinal row 100B. Each DUT board 60i comprises one or more contact areas 100Aj at one end and one or more contact areas 100Bj at the opposing end, all contact areas 100 being arranged on the lower side (generally the opposed side where the DUT(s) is/are located) of the DUT board 60i. In the embodiment of FIG. 3A, the DUT board 60A comprises contact areas 100A1 and 100A2 at one end and contact areas 100B1 and 100B2 at the opposite end. Accordingly, the DUT board 60B comprises contact areas 100A3 and 100A4 at one end and contact areas 100B3 and 100B4 at the opposite end, and so on.

In accordance with the alignment of the contact areas 100Aj in the line 100A and the contact areas 100Bj in the line 100B, the test head 40 provides a line 95A of contact areas 95Aj to be coupled to the corresponding contact areas 100Aj of line 100A, and contact areas 95Bj in a line 95B to be coupled to the corresponding contact areas 100Bj of line 100B. In the embodiment of FIG. 3A, the alignment and arrangement of the contact areas 100Aj substantially matches with the alignment and arrangement of the contacts areas 95Aj. Accordingly, the alignment and arrangement of the contact areas 100Bj substantially matches with the alignment and arrangement of the contact areas 95Bj.

Figure 3B:
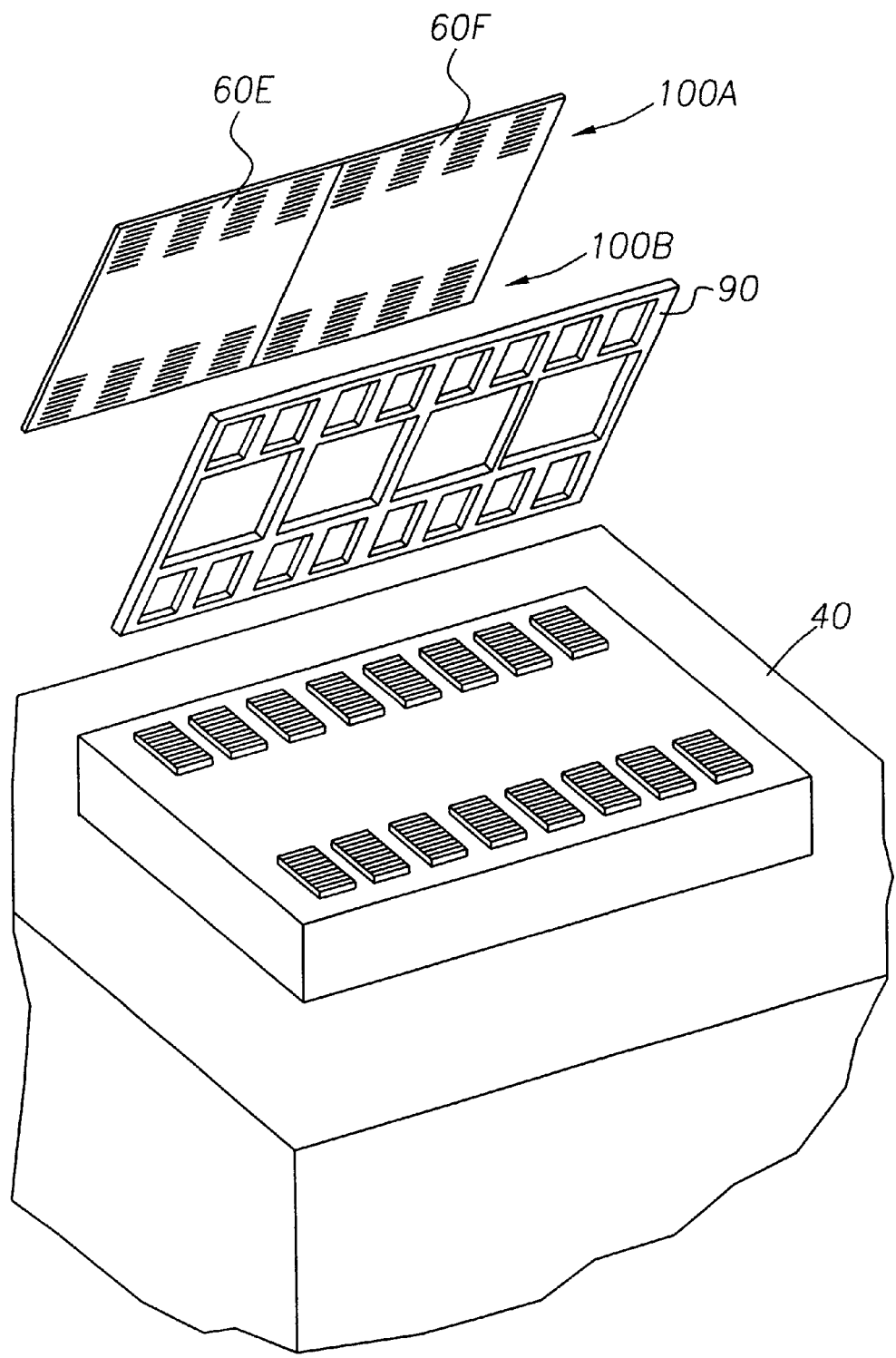
Figure 3C:
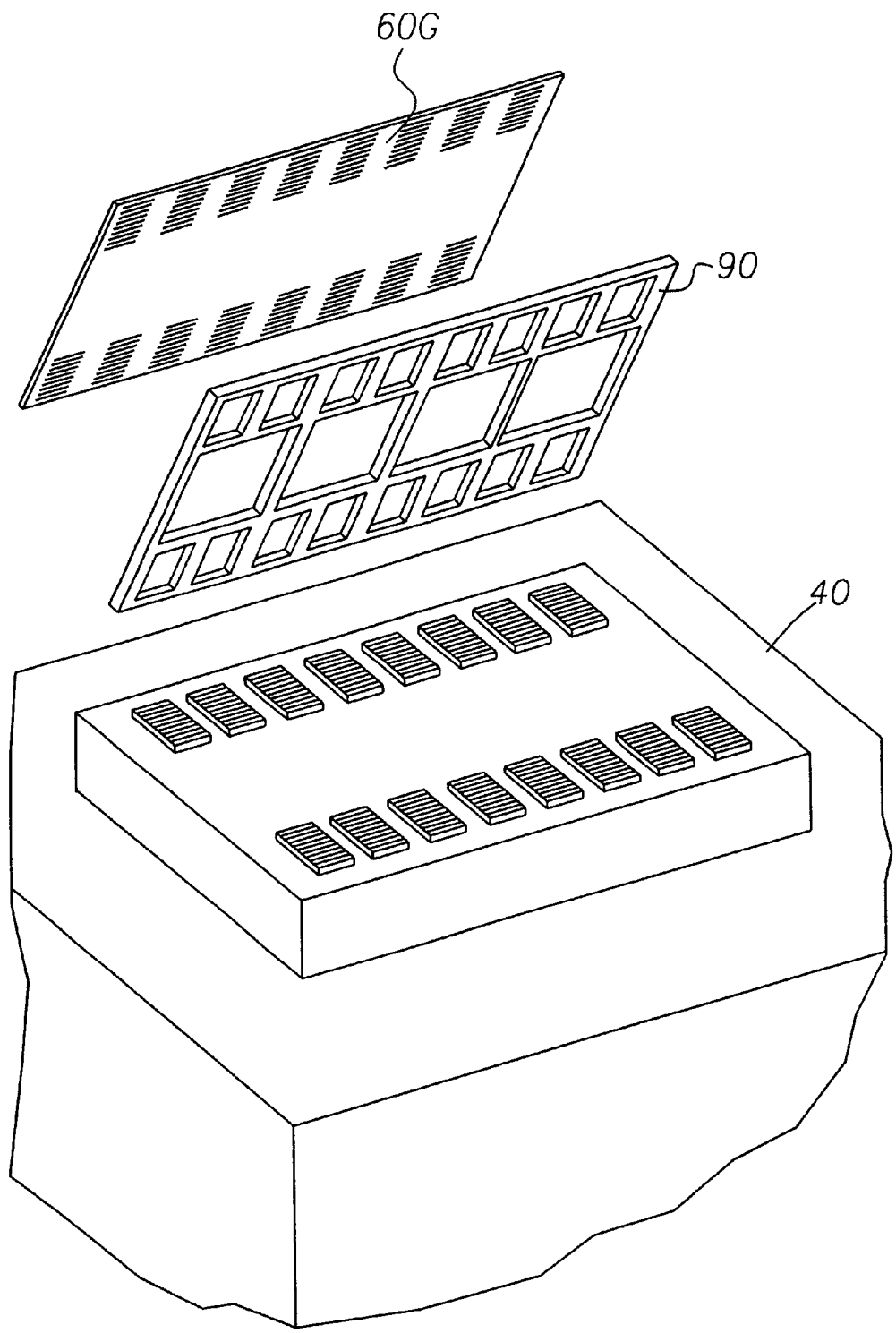

The advantage of the invention becomes readily apparent with respect to the embodiments illustrated in FIGS. 3B and 3C which substantially correspond to the embodiment of FIG. 3A, however, with exception of the DUT boards 60i. Instead of four individual DUT boards 60A . . . 60B shown in FIG. 3A, the embodiment of FIG. 3B only has two individual DUT boards 60E and 60F, whereby the DUT board 60E covers substantially the same breadth as the DUT boards 60A and 60B, and DUT board 60F covers substantially the same breadth as DUT boards 60C and 60D. In the embodiment of FIG. 3C, only one DUT board 60G is employed which substantially covers the same breadth as the DUT board 60E and 60F or, accordingly, the DUT boards 60A . . . 60D.

Figure 2A:
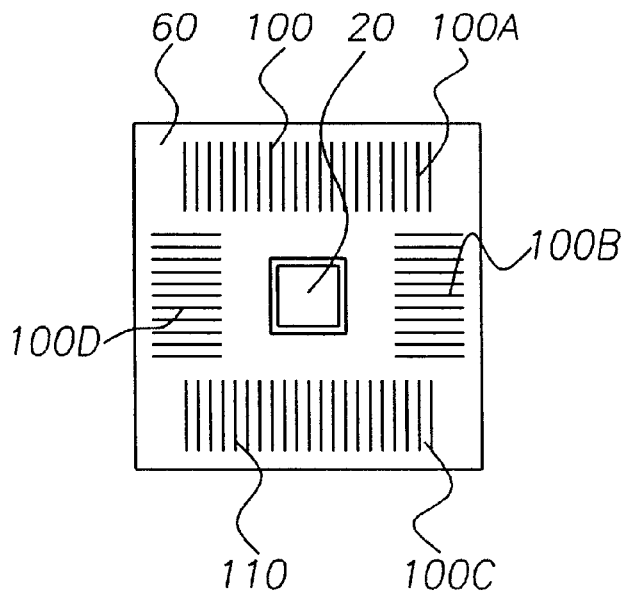
FIGS. 2A to 2D show examples of DUT boards 60 as known in the art.
Figure 2C:
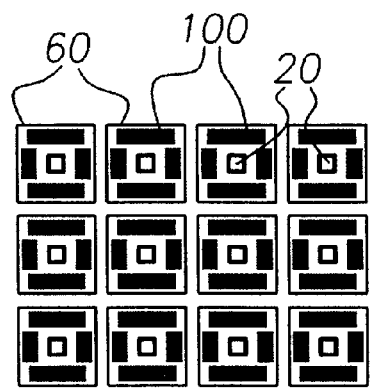
Figure 2B:
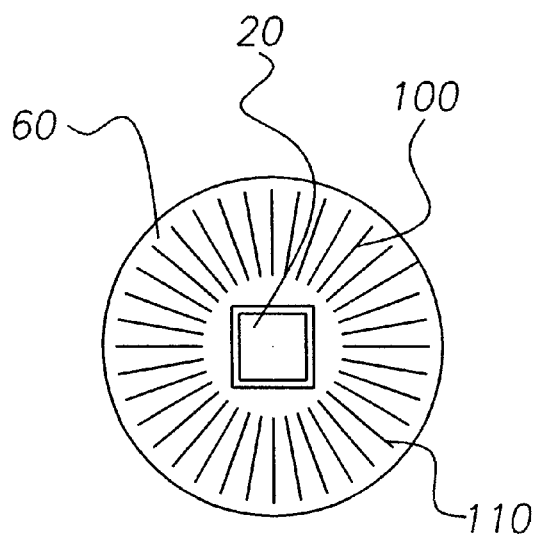

For attaching the embodiments of FIG. 3B or FIG. 3C onto the test head 40, the stiffener 90 as shown in FIG. 3A, or a correspondingly modified one, can be employed, as far as the stiffener is required. The arrangement according to the invention allows to use all the DUT boards as shown for the embodiments of FIG. 3A to FIG. 3C for the same test head 40 (as shown in FIG. 3A) without any hardware modification. This arrangement significantly distinguishes in particular from the device specific arrangement e.g. according to FIG. 2C in that the invention allows to more flexibly employ different DUT boards with different breadths, all using the same hardware design of the test head 40 in FIGS. 3A–3C. Whereas a change in the lateral dimensions of the DUT boards 60 is not possible in FIG. 2C without changing the respective contact area design of the test head 40, the invention allows to vary the breadths of the DUT boards without any hardware modification required.

It is to be noted that the one or more DUT boards 60i (with i=A . . . G), as shown in the FIGS. 3A and 3B, lined up in a row do not have to cover the full applicable breadth of the test head 40, i.e. where contact areas 95 are provided. Instead of employing four DUT boards 60 as shown in FIG. 3A, only one, two or three of such DUT boards could be used not covering the fully applicable breadth for aligning DUT boards. Accordingly, only one of the DUT boards 60E or 60F in FIG. 3B could be used. On the other hand, a mixture of DUT boards 60 with different breadths is also applicable. As an example, one DUT board 60E according to FIG. 3B could be employed together with one or two of the DUT boards 60 according to FIG. 3A.

Figure 2D:
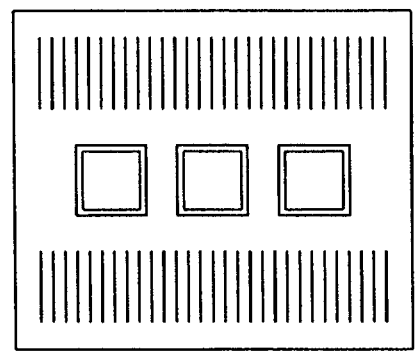

It is noted that in the embodiments of FIGS. 3A–3C, the individual contacts of the contact areas as well of the DUT boards 60i as of the test head 40 are respectively aligned substantially perpendicular to the alignment of the contact areas. However, it is clear that the alignments of the individual contacts can also be in parallel to the alignment of the contact areas, e.g. as shown in FIG. 2D.

The arrangement according to the invention not only allows to flexibly (ex)change and arrange DUT boards 60, but also to modularly arrange the test head 40. In the latter case, the user can choose the pin count, i.e. the number of individual contacts and contact areas, of the test head 40 within the same mechanical casing/frame 200 of the test head 40. For cost reasons, or in case that only a low pin count is required, the user might choose a reduced test head with, for example, only the contact areas 95A1–95A2 and 95B1–95B2. For a medium pin count, the user might choose a test head with the contact areas 95A1–95A4 and 95B1–95B4. For a high pin count, the user will choose the full arrangement of contact areas 95Aj and 95Bj as shown in the lower part of FIGS. 3A–C. The modularity of the arrangement according to invention further allows to simply upgrade from the low pin count version to the medium or the high pin count version by simply adding the respective contact areas (and corresponding test electronics) to the test head 40. Preferably, the test electronics corresponding to respective contact areas is arranged/located underneath the respective contact areas, thus allowing a higher degree of modularity.

In another embodiment, the test electronics and contact areas can be modularly employed for different casings 200 with different lateral dimensions. That means that the user can reuse the test electronics and contact areas when upgrading from a smaller casing 200 to a larger one.

It is to be understood that the invention is not limited to the arrangement of individual DUT boards 60 in one row, but also that-more than one (preferably parallel) rows are applicable. Accordingly, the invention is not limited to DUT boards 60 with two contact areas. DUT boards with either only one contact area or more than two contact area can also be employed for the purpose of the invention.

The stiffener 90 has to be designed to provide sufficient mechanical stability and stiffness to the DUT boards, and might comprise a base frame plate, guiding bushings for positioning, cam bearings, and/or mounting holes for the DUT board(s).

With the solution according to the invention it is possible to use the same DUT board 60 on a test head 40 with a low pin count, a medium pin count (e.g. double pin count) or a high pin count (e.g. four times). The advantage for a user might be that in a start phase for testing only singular DUTs 20, only a small and thus cheap DUT board 60 is required. In a volume phase for testing a plurality of DUTs 20 in parallel, the small DUT board 60 (of the start phase) only has to be complied and can be used e.g. on the medium pin count test head 40, whereby no change of the DUT board 60 is necessary since it will be the same electrical behavior if testing one or two DUTs 20 in parallel. If a damage on one of the DUT boards 40 occurs, the other DUT boards (s) is/are still in use, thus leading to a high reliability and short time break.

In a high volume phase for testing high quantities of the DUT 20, the small DUT board(s) (of the start and/or volume phase) can be copied and used e.g. in the high pin count test head 40. Again, no change of the DUT board 60 and/or the test head 40 (except of a possible upgrade—if required) is necessary, and a damage in one DUT board can easily be covered by the other DUT boards. In particular for the high volume phase, applying a plurality of individual (small) DUT boards 60 can represent a significant cost advantage over large and costly combined DUT boards.

In a lower volume phase of the DUT 20, e.g. at the end phase of a product cycle, the high pin count test head 40 might be used for testing a different type-of DUT, so that only e.g. the medium pin count of the test head 40 will be applied for testing the DUT 20 of the lower volume phase.

The solution according to the invention provides the advantage that the user can control his investments in the test system 10 depending on the test volume of the devices to be tested. And even after a certain investment has been made, e.g. for the high volume phase, the user can still use this investment and transfer more and more of the testing resources without requiring unduly and costly hardware modifications for testing different DUTs.

What is claimed is:

1. A test head assembly for a test system, the system capable of testing a plurality of different laterally sized boards, comprising:

a test head having a plurality of test head contact areas, each with one or more individual contacts, for providing electronic signals to or receiving electronic signals from one or more devices under test, a number of boards for holding said one or more devices under test, and for coupling electrical contacts thereof to at least one of said plurality of test head contact areas, each board having a lateral dimension, the total lateral dimension of said number of boards not exceeding the lateral dimension of the test head, said number of boards comprises boards having the same lateral dimensions or boards having different lateral dimensions, and at least one mounting device for fastening said number of boards to said test head, wherein the arrangement of said at least one mounting device and said plurality of test head contact areas is configured so that said number of boards are attachable to the test head.

2. The test head assembly of claim 1, wherein: the at least one mounting device and the plurality of test head contact areas are arranged in one or more longitudinal rows.

3. The test head assembly of claim 2, wherein:

each board comprises at least one device under test contact area having one or more individual contacts electrically coupled to the one or more devices under test of that respective board, each device under test contact area can be coupled to at least one of the plurality of test head contact areas for providing an electrical contact between the respective board and the test head, and each device under test contact area is arranged substantially parallel to one or more longitudinal rows.

4. The test head assembly of claim 1, wherein:

said number of-boards comprises one board.

5. The test head assembly of claim 1, wherein;

at least one of said number of boards is attached to at least two of said test head contact areas.

6. The test head assembly of claim 1, wherein:

the total lateral dimension of said number of boards is about equal the lateral dimension of said test head.

7. A system for testing a plurality of different sized boards on a single test head, the boards holding devices under test, said system comprising:

a test head having a plurality of test head contact areas; each with one or more individual contacts, for providing electrical signals to or receiving electrical signals from one or more devices under test, one or more devices under test, and at least one board for holding one or more of said devices under test and for coupling electrical contacts thereof to at least one of said plurality of test head contact areas, said at least one board having a total lateral dimension up to the lateral dimension of the test head, said number of boards comprises boards having the same lateral dimensions or boards having different lateral dimensions, wherein said at least one board is removably attached to said test head.

8. The system of claim 7, wherein:

said at least one board comprises one board.

9. The system of claim 7, wherein:

one of said at least one board is attached to at least two of said test head contact areas.

10. The system of claim 7, wherein each board comprises at least one device under test contact area having one or more individual contacts electrically coupled to the one or more devices under test of that respective board, each device under test contact area can be coupled to at least one of the plurality of test head contact areas for providing an electrical contact between the respective board and the test head.

11. The system of claim 7, wherein:

the plurality of test head contact areas are arranged in one or more longitudinal rows.

12. The system of claim 7, further comprising:

a mounting device for fastening said at least one board to said test head.

13. A method of testing devices under test on a single test head, regardless of the number of boards holding the devices under test, comprising:

providing a test head having test head contact areas; each of the contact areas with one or more individual contacts for providing electrical signals to or receiving electrical signals from one or more devices under test;

providing a plurality of devices under test;

providing a number of boards for holding the plurality of devices under test, the number of boards having a lateral dimension at least within the lateral dimension of the test head, said number of boards comprises boards having the same lateral dimensions or boards having different lateral dimensions;

removably attaching the number of boards to the test head; and testing the devices under test.

14. The method of claim 13, wherein:

the number of boards comprises one board.

15. The method of claim 13, wherein:

one of the number of boards is attached to at least two of the test head contact areas.

16. The method of claim 13, further comprising:

providing at least one mounting device for mounting the any number of boards to the test head.

17. The method of claim 13, wherein:

the plurality of test head contact areas are arranged in one or more longitudinal rows.

* * * * *